United States Patent [19]

Hadersbeck et al.

[11] 4,357,647
[45] Nov. 2, 1982

[54] PRINTED CIRCIUIT BOARD

[75] Inventors: Hans Hadersbeck; Hubert Zukier, both of Munich, Fed. Rep. of Germany

[73] Assignee: Siemens Aktiengesellschaft, Berlin & Munich, Fed. Rep. of Germany

[21] Appl. No.: 202,610

[22] Filed: Oct. 31, 1980

[30] Foreign Application Priority Data

Dec. 6, 1979 [DE] Fed. Rep. of Germany ....... 2949184

[51] Int. Cl.³ .............................................. H05K 1/18
[52] U.S. Cl. .................................... 361/400; 361/403; 361/406; 361/414
[58] Field of Search ............... 361/400, 403, 405, 406, 361/414

[56] References Cited

U.S. PATENT DOCUMENTS

| | | | |
|---|---|---|---|
| 2,984,768 | 5/1961 | Henry | 361/400 |
| 3,013,188 | 12/1961 | Kohler | 361/406 |
| 3,293,500 | 12/1966 | Scheffer | 361/400 X |
| 3,404,214 | 10/1968 | Elliott | 361/403 X |
| 3,588,616 | 6/1971 | Palazzini | 361/400 |
| 3,775,725 | 11/1973 | Endo | 361/414 X |
| 4,139,881 | 2/1979 | Shimizu | 361/406 X |
| 4,228,412 | 10/1980 | Dalley | 361/400 X |
| 4,288,840 | 9/1981 | Konishikawa | 361/406 X |

Primary Examiner—R. R. Kucia
Attorney, Agent, or Firm—Hill, Van Santen, Steadman, Chiara & Simpson

[57] ABSTRACT

A printed circuit board has temperature-stable electric components, such as resistance networks, disposed on the soldering side of the circuit board. The components mounted on the soldering side of the board are mounted as a unit containing the network, which unit has a recess which partially surrounds the solder connection location of the circuit board, at which point the unitary component is electrically and mechanically connected to the board. The recesses are beveled to facilitate solder flow, and cover approximately half of the connection location of the circuit board.

2 Claims, 3 Drawing Figures

PRINTED CIRCIUIT BOARD

BACKGROUND OF THE INVENTION

1. Field of the Invention

The present invention relates to printed circuit boards on which one or more electronic components are interconnected by means of printed conductors on the circuit board.

2. Description of the Prior Art

In the assembly of electronic circuit boards on which a number of electronic components are to be mounted, it is customary, particularly for communications apparatus, to pre-combine a number of components into a unitary network such as a resistance network, a capacitance network or an RC network, or hybrids thereof. Such networks are conventionally mounted on the upper components side of the printed circuit board. Generally, resistance networks are manufactured by means of vapor-depositing or imprinting of resistance layers on relatively thin substrates. This method generates a favorable resistance network, however, the network so produced occupies a relatively large area when installed on the printed circuit board.

Such resistance networks are generally equipped with component legs and require a large number of connection locations for electrical and mechanical contact with the circuit board. Equipping conventional resistance networks further adds to the expense of manufacture of such networks. The connection of the resistance layers to the legs which form the component leads generally is undertaken by soldering one appropriately shaped end of the lead to a particular resistance layer. The lead wires are then, if necessary bent 90° for "dual-in-line" insertion, and are inserted into the soldering lugs on the upper side of a printed circuit board. The component legs are then electrically connected to the board, for example, by dip soldering.

It is known from an article by Klasche in "Elektronik", 1979 Vol. 19, pp. 52–65 to mount components in chip-form on the soldering side of a circuit board. As disclosed in the article, however, such a mounting technique is for use with an entirely new printed circuit board technology, rather than with conventional circuit boards.

SUMMARY OF THE INVENTION

It is an object of the present invention to provide a printed circuit board having a larger number of components per area and which permits connection of two components at the same connection location.

The above object is inventively achieved in an electronic circuit board on which all components which are temperature stable, that is substantially resistant to high temperatures, are disposed on the bottom or soldering side of a conventional printed circuit board which is clad only on one side. The entire soldering side of such a printed circuit board is thus available for accommodating such temperature-stable components. Moreover, the space opposite such temperature-stable components on the component side of the circuit board is substantially less restricted by components such as resistance networks. In this manner, the entire surface of the component side of the board can be utilized for non-temperature-stable components. Resistance networks are particularly well suited for attachment in this manner because such components, made in the manner described above, are inherently temperature-stable so that any temperature stress which may otherwise occur during the soldering operation does not affect such networks.

In accordance with a further embodiment of the invention, the outlay for equipping resistance networks with component legs is eliminated. This is achieved in that the components embodying the network is formed as a unitary element having recesses for contacting the support plate for the network at the connection location. During flow soldering, these recesses render possible an immediate spreading of the solder about the connection locations of the network and the connection locations on the printed wiring board disposed adjacent to the network. This leaves the hole in the printed circuit board free to receive the lead wire from a component mounted on the component side of the circuit board opposite the network mounted on the solder side.

The lateral edge of the recesses in the support plate for the network components, which is disposed parallel to the longitudinal side of the support plate, is beveled and covered with a metal layer having good conductivity which extends at the border into the covering surface of the support plate. In order to simultaneously obtain good coating of the lateral edges during vapor-deposition of the metal layers, the bevel is disposed at approximately 60° to the cover surface.

The support plates for the components are fixed in their dimensions so as to cover approximately half of the connection locations on the printed circuit board. The solder can thus reach the soldering locations on the printed circuit board without the normally interfering influence of the solder depression. Moreover, this also renders possible the mounting of a second network component, such as an additional resistance network, on the same contact location adjacent to a first temperature-stable component.

DESCRIPTION OF THE DRAWINGS

FIG. 1a is an elevational plan view of the network shown in FIG. 1 mounted on a portion of a printed circuit board.

DESCRIPTION OF THE PREFERRED EMBODIMENTS

Figure 1:
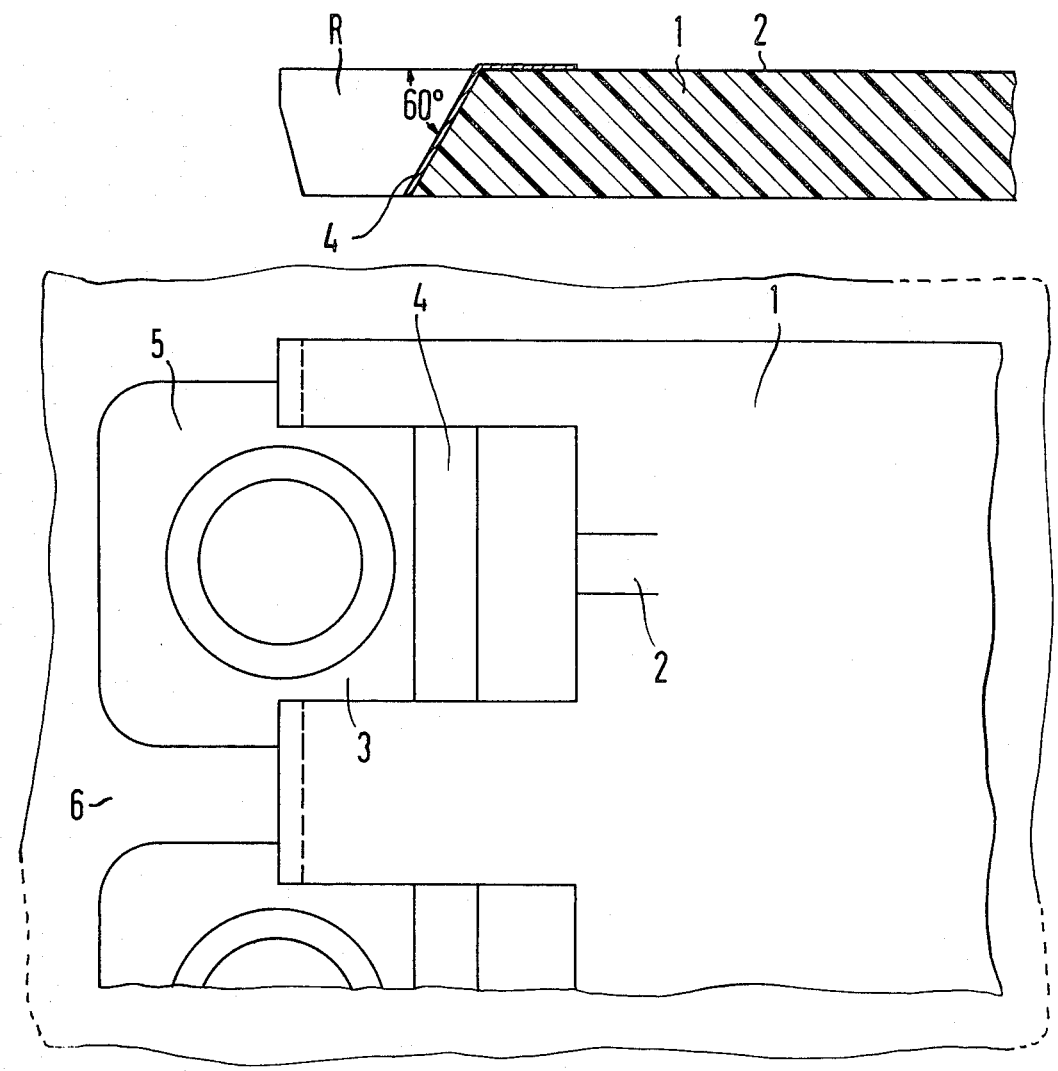
FIG. 1 is a sectional view of a resistance network constructed in accordance with the principles of the present invention for use in conjunction with a printed circuit board.

A temperature-stable resistance network is shown in section in FIG. 1 which consists of a support plate 1 having a resistance layer 2 as a covering surface. The support plate 1 may consist, for example, of a spray-technically processed plastic such as polyphenylene sulfide (PPS). At the border of the support plate 1 are provided a plurality of recesses 3 which serve as connection locations for the network. In order to simultaneously obtain a good coating of the lateral edges of the recesses 3 during the vapor-deposition of metal layers 4, the lateral edges are oblique with respect to the covering surface, such as, for example at an angle of 60°. The connection location on the printed circuit board is referenced at 5. As can be seen in FIG. 1a, the connection locations are approximately half-covered by the support plate 1. The solder employed to mount the network to the printed circuit board can thus reach the solder location on the circuit board without the interfering influence of the solder depression of hole extending through the circuit board.

Figure 2:
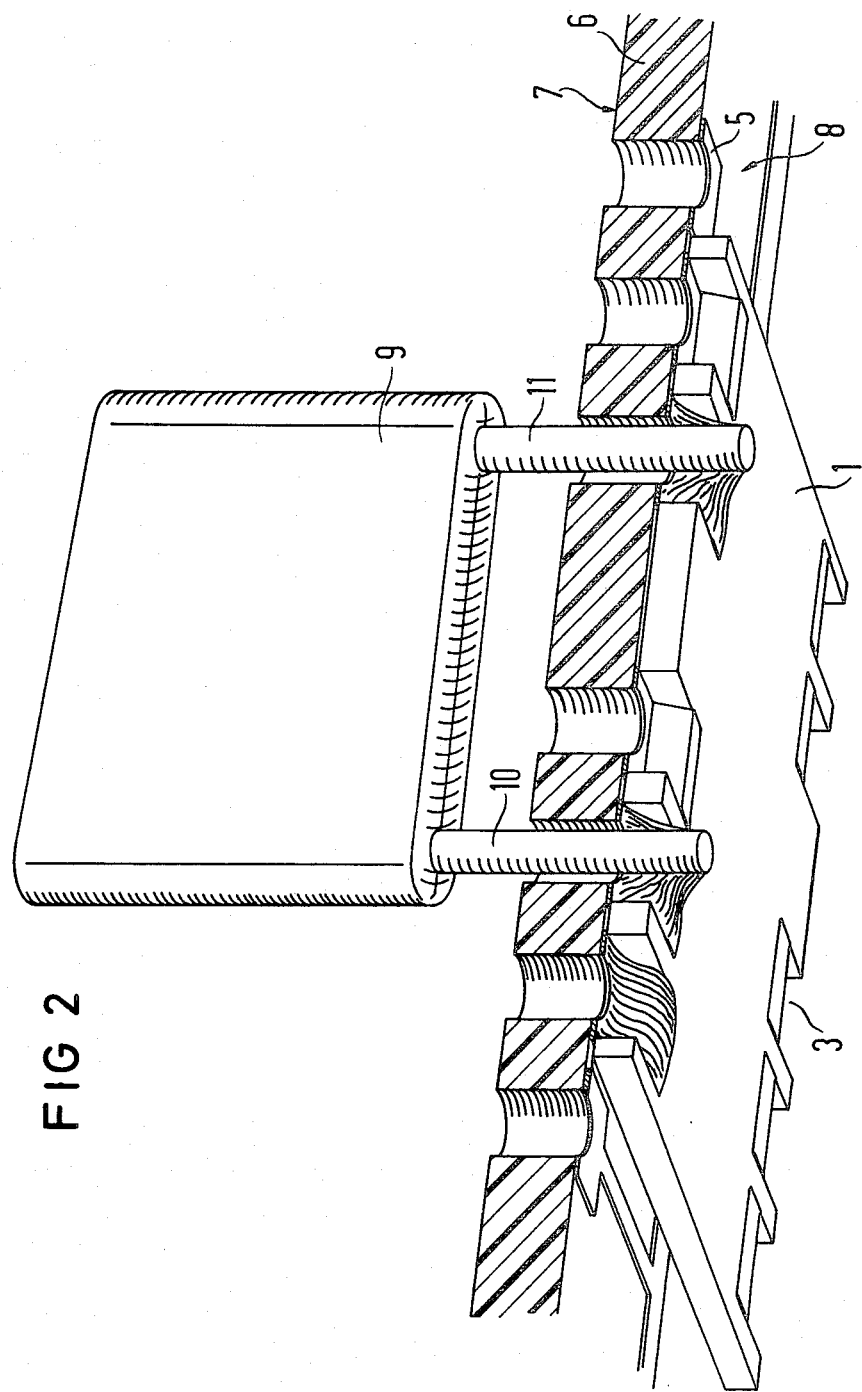
FIG. 2 is a perspective view, partly in section, showing the manner of mounting of the network shown in FIGS. 1 and 1a to a printed circuit board.

A segment of the circuit board is referenced at 6 in FIG. 1a and can be seen in perspective in FIG. 2. As shown in FIG. 2, the board 6 has a component side 7 and a soldering side 8. The manner of attachment of the support plate 1 of a network of the type shown in FIG. 1 can be seen in FIG. 2. As can also be seen, an additional component, such as a capacitor 9 having lead wires 10 and 11, can be mounted on the component side of the board 6 directly opposite the temperature-stable network mounted below.

Although the inventive concept disclosed and claimed herein may be utilized in connection with any type of pre-manufactured network, the manufacture of a resistance network of the type which may be utilized in the present invention is described as comprising the following method steps. The support plate 1 is first manufactured utilizing spray technology and serves as the substrate. The support plate 1 may be manufactured in a components format or unitary format. This is followed by the vapor-deposition of the resistance layer 2 and a metal layer consisting of, for example, copper. The metal layer on the covering surface is then coated with positively acting photoresist such as, for example, by a roller-coater. Exposure of the photoresist follows utilizing galvanic covering for the purpose of building up the contact zones 4, which must have good conductivity. This is followed by a series of repeated exposures utilizing etching technology for generating the resistance network. The vapor-deposited conductive metal layer is then removed by further etching. This is followed by etching of the resistance layer and removal of the remaining photoresist. Finally, the vapor-deposited conductive metal layer on the resistance structure is removed by etching. If necessary, a temperature treatment of the resistance layer may be undertaken. Correction of the resistance values can then be undertaken by any suitable means such as, for example, by means of layer processing. Passivation of the resistance structure is then undertaken such as, for example, by the application of a protective lacquer. If the parts are manufactured in the unitary format, the individual parts are then separated and are placed in position on the soldering side of a printed circuit board and attached thereto such as, for example, by flow soldering.

Although modifications and changes may be suggested by those skilled in the art, it is the intention of the inventors to embody within the patent warranted hereon, all changes and modifications as reasonably and properly come within the scope of their contribution to the art.

We claim as our invention:

1. A temperature-stable component for mounting on a printed circuit board having a plurality of solder-clad holes therein, said holes being selectively interconnected by printed conductor paths on said circuit board, said temperature-stable component comprising a support plate having longitudinal sides with a plurality of recesses therein for partially surrounding said solder-clad holes in said circuit board for electrical and mechanical connection thereto by soldering, each said recess having a lateral edge disposed parallel to said longitudinal sides, said lateral edge being beveled with respect to a surface of said support plate and further being coated with a metal layer having a good electrical conductivity extending from said lateral edge to said surface of said support plate.

2. The circuit board of claim 1 wherein said recesses are selectively dimensioned for covering substantially one half of said solder holes in said circuit board.

* * * * *